United States Patent
Lai et al.

(10) Patent No.: US 8,279,102 B2
(45) Date of Patent: Oct. 2, 2012

(54) METHOD AND APPARATUS FOR ANALOG TO DIGITAL CONVERSION

(75) Inventors: Fang-Shi Jordan Lai, Chia Yi (TW); Hsu-Feng Hsueh, Tainan (TW); Cheng Yen Weng, Hsinchu (TW); Yung-Fu Lin, Hsinchu (TW); Manoj M. Mhala, Hsinchu (TW); Tao Wen Chung, Zhubei (TW); Chin-Hao Chang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 73 days.

(21) Appl. No.: 12/898,261

(22) Filed: Oct. 5, 2010

(65) Prior Publication Data

US 2012/0081244 A1    Apr. 5, 2012

(51) Int. Cl.
 *H03M 1/38* (2006.01)
(52) U.S. Cl. ............ 341/161; 341/155
(58) Field of Classification Search ............ 341/161, 341/172, 155
See application file for complete search history.

(56) References Cited

U.S. PATENT DOCUMENTS

| | | | |
|---|---|---|---|
| 7,064,700 B1 * | 6/2006 | Garrity et al. | 341/155 |
| 7,561,095 B2 * | 7/2009 | Sasaki et al. | 341/161 |
| 7,834,786 B2 * | 11/2010 | Kawahito et al. | 341/120 |
| 2009/0289821 A1 | 11/2009 | Li et al. | |

OTHER PUBLICATIONS

Hsu, C.C. et al., "A CMOS 33-mW 100-MHz 80-dB SFDR Sample-and-Hold Amplifier", IEICE Trans. Electron, Jan. 2002, E85-C(1):1-7.

* cited by examiner

*Primary Examiner* — Brian Young
(74) *Attorney, Agent, or Firm* — Duane Morris LLP

(57) ABSTRACT

An analog to digital converter (ADC) comprises an input node having a variable analog input voltage, first and second switched capacitor circuits, an operational amplifier, and a control circuit. The first switched capacitor circuit has first and second capacitors and is coupled to the input node, and the second switched capacitor circuit has third and fourth capacitors and is coupled to the input node. The operational amplifier is configured to be conditionally coupled to only one of the first and second switched capacitor circuits at a time and configured to conditionally provide feedback to the switched capacitor circuits via an output node. The control circuit is coupled to the first and second switched capacitor circuits for conditional coupling to the operational amplifier.

20 Claims, 5 Drawing Sheets

METHOD AND APPARATUS FOR ANALOG TO DIGITAL CONVERSION

BACKGROUND

Pipeline analog to digital converters (ADC) are known to be useful for high speed and high resolution conversion of analog signals to digital format. A pipeline ADC has a number of stages, e.g., N stages, coupled in series or cascade. Each stage is designed to produce one bit of an N-bit digital representation of an analog input signal. Details on known pipeline ADCs are provided in U.S. Pat. Pub. No. 2009/0289821 by Li et al, which is hereby incorporated by reference in its entirety.

Sample-and-hold amplifiers are known to be useful for capturing and storing an analog voltage sampled at a predetermined point in time, and can be applied to pipeline ADCs. Certain sample-and-hold amplifier arrangements are described, e.g., in U.S. Pat. Pub. 2009/0195315 by Chou et al, which is hereby incorporated by reference in its entirety. A known sample-and-hold amplifier ("SHA") includes first and second sampling capacitors for functionality known as pre-charging, as described in U.S. Pat. No. 6,529,049 by Erhart et al., hereby incorporated by reference in its entirety. An analog voltage from an analog voltage source is stored on the sampling capacitors and is transferred to an input of an operational amplifier, e.g., a unity gain amplifier. The second sampling capacitor is enabled, e.g., by a coupling arrangement of switches, to pre-charge the input of the amplifier to a sampled analog voltage, which is achieved by the first sampling capacitor by known techniques. Provided that the sampled analog voltage stored on the first sampling capacitor is close to the pre-charged voltage already applied to the amplifier input by the second sampling capacitor, the error in the analog voltage provided at the output of the amplifier is reduced, and/or operation of the ADC is faster, compared to SHAs that do not employ pre-charging.

In a known pipeline ADC, a pre-charged SHA is combined with a pipeline ADC for sampling an analog input signal and converting it to digital format. Time interleaving is known in the art for processing data in the context of a pipeline ADC simultaneously on a number of channels. For example, for two data channels, a stage of a pipeline ADC according to a known technique is processed by two separate switched capacitor circuits in a circuit 100 shown in FIG. 1. A first switched capacitor circuit 110a and a second switched capacitor circuit 110b are both coupled to a sample-and-hold amplifier (SHA) 105 via input node 102. Switched capacitor circuit 110a has capacitors 131, 132, and operational amplifier 130a, and switched capacitor circuit 110b has capacitors 133, 134, and operational amplifier 130b. Switches 123a, 123b, 123c, 123d (123 generally) and switches 124a, 124b, 124c, 124d (124 generally) control a coupling arrangement between the capacitors 131, 132, 133, 134, input node 102, and operational amplifiers 130a and 130b. Switches 123a, 123b, 123c, and 123d are controlled by a first signal and thus open or close together. Switches 124a, 124b, 124c, and 124d also open or close together but are controlled by a second signal that is the complement of the first signal. Switched capacitor circuits 110a and 110b have two states. In a first state, switches 123 are closed and switches 124 are open, causing capacitors 131, 132, 133, and 134 to store the voltage corresponding to node 102. In a second state, switches 124 are closed and switches 123 are open, creating feedback loops including capacitors 131, 132, 133, 134 and operational amplifiers 130a, 130b. A multiplexer 180 selects between the outputs of operational amplifiers 130a and 130b based on a select signal SEL. Control circuitry to control switches 123 and 124 is not shown in FIG. 1. An output of multiplexer 180 may be converted by a digital to analog converter (DAC) 160 to analog signal that is provided as a reference voltage for switched capacitor circuits 110a and 110b. The output of multiplexer 180 may be passed to a next pipeline stage. The input signal at input node 102 is converted by a DAC 162 to analog signal $V_rD_j$. DACs 162 and 160 provide bit processing for a current pipeline stage and a next pipeline stage.

SUMMARY

In some embodiments, an analog to digital converter (ADC) comprises an input node having a variable analog input voltage, first and second switched capacitor circuits, an operational amplifier, and a control circuit. The first switched capacitor circuit has first and second capacitors and is coupled to the input node, and the second switched capacitor circuit has third and fourth capacitors and is coupled to the input node. The operational amplifier is configured to be conditionally coupled to only one of the first and second switched capacitor circuits at a time and configured to conditionally provide feedback to the switched capacitor circuits via an output node. The control circuit is coupled to the first and second switched capacitor circuits for conditional coupling to the operational amplifier.

In some embodiments, an N-bit pipeline analog to digital converter (pipeline ADC) comprises a chain of N multiplying digital to analog converters (MDACs) coupled in series and a digital-to analog converter (DAC). Each MDAC comprises an input node having a variable analog stage input voltage, first and second switched capacitor circuits, an operational amplifier, and a control circuit. The first switched capacitor circuit has first and second capacitors coupled in parallel to one another and is coupled to the input node, and the second switched capacitor circuit has third and fourth capacitors coupled in parallel to one another and is coupled to the input node. The operational amplifier is configured to be conditionally coupled to one and only one of the switching circuits and configured to conditionally provide a digital stage output signal to the switched capacitor circuits via an output node. The control circuit is configured to provide a plurality of switching signals to control a coupling arrangement of the switched capacitor circuits. The DAC is configured to receive the digital stage output signal and provide a stage reference signal to the first and second switched capacitor circuits via a reference node.

The construction and method of operation of various embodiments, however, together with additional advantages thereof will be best understood from the following descriptions of specific embodiments when read in connection with the accompanying figures.

BRIEF DESCRIPTION OF THE DRAWINGS

The following will be apparent from elements of the figures, which are provided for illustrative purposes and are not necessarily to scale.

DETAILED DESCRIPTION

Figure 1:
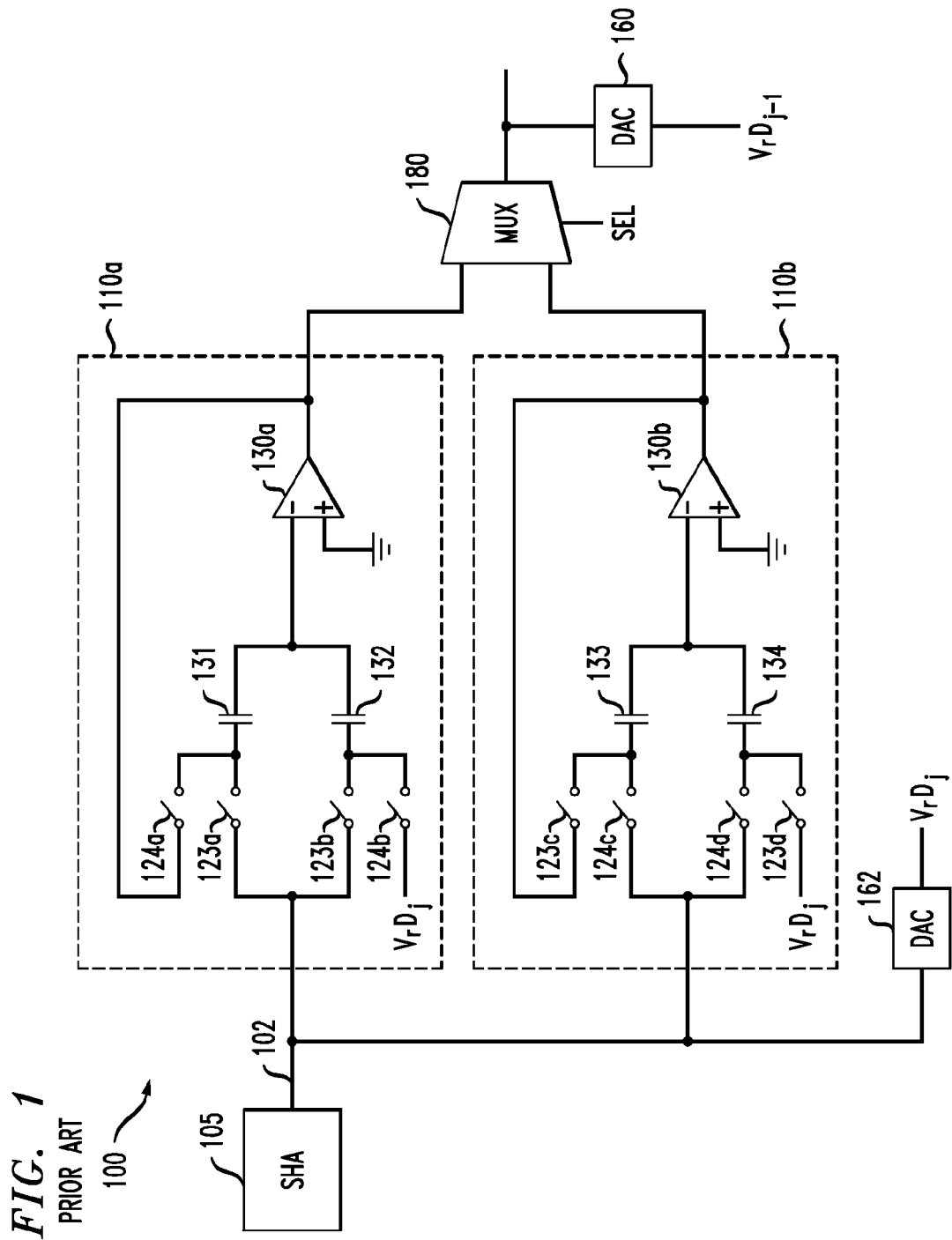
FIG. 1 is a diagram of a known circuit used in an analog to digital converter (ADC).
Figure 2:
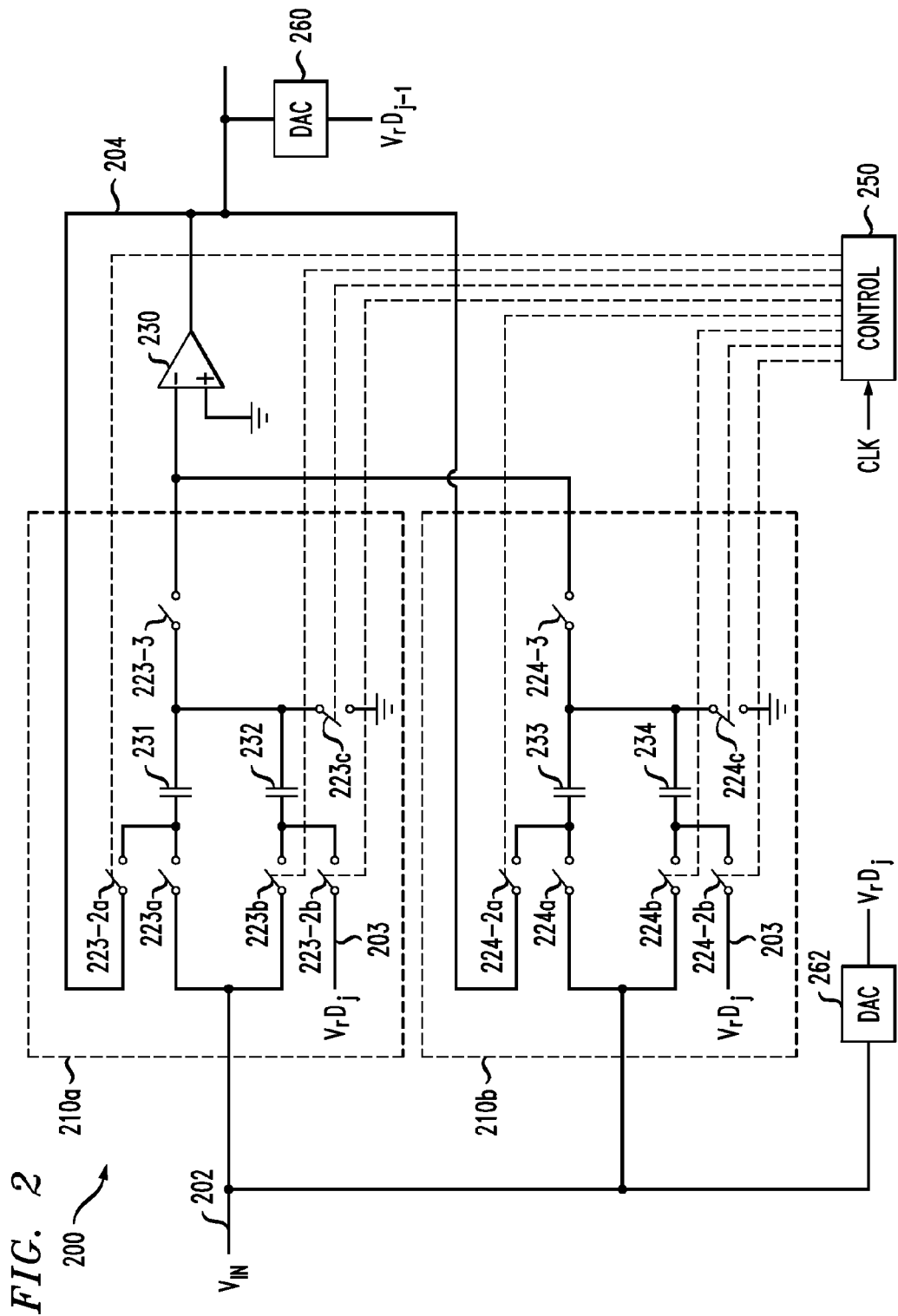
FIG. 2 is a diagram of a an analog to digital converter (ADC) circuit in accordance with an exemplary embodiment of this disclosure.

FIG. 2 is a diagram of an analog to digital converter (ADC) circuit 200 in accordance with an exemplary embodiment. A first switched capacitor circuit 210a has capacitors 231 and 232, and a second switched capacitor circuit 210b has capacitors 233 and 234. A plurality of switches control a coupling arrangement between the capacitors of switched capacitor circuits 210a, 210b and an operational amplifier 230. The switches may include switches 223a, 223b, and 223c (223 generally) which open or close together; switches 223-2a and 223-2b (223-2 generally) which open or close together; switches 224a, 224b, and 224c (224 generally) which open or close together; switches 224-2a and 224-2b (224-2 generally) which open or close together; and switches 223-3 and 224-3, only one of which is open (or closed) at any given time. A control circuit 250 receives a clock signal and provides control signals to control the switches conditionally, in particular repetitively to cycle through successive states in which certain switches are closed and other switches are open, with the result being that capacitors in one group (switched capacitor circuit) are precharging while those in the other group provide voltages that are coupled through to determine an output value, and then the groups exchange functions so that the second group precharges and the first is coupled through to determine the output value. The manner in which the control signals control the switches is described further below in the context of FIG. 3A. The switches are generally illustrated as contacts, but it should be understood that in practical embodiments the switches preferably comprise FET switches responsive to control signals from a control configuration such as a logic network or the like (not shown).

Switches 223a and 223b conditionally couple capacitors 231 and 232 to input node 202 having voltage $V_{in}$, which may be a variable analog input voltage. Similarly, switches 224a and 224b conditionally couple capacitors 233 and 234 to input node 202. Operational amplifier 230 is configured to be conditionally coupled, based on switches 223-3 and 224-3, to only one of the switched capacitor circuits 210a, 210b at a time and is configured to conditionally provide feedback, based on switches 223-2a and 224-2a, to switched capacitor circuits 210a, 210b via an output node 204. The control circuit 250 is configured to operate in switched phases, with certain of the phases (described further below) coupling either switched capacitor circuit 210a or 210b to input node 202. The switched capacitor circuits 210a and 210b are conditionally coupled, based on switches 223-3 and 224-3, to one of an inverting input and a noninverting input of operational amplifier 230 (e.g., to an inverting input as shown in FIG. 2), with the other input coupled to a ground node. Switches 223-2b and 224-2b conditionally couple capacitors 232 and 234, respectively, to a reference node 203 having a reference voltage $V_rD_j$, which may be an output of a digital to analog converter (DAC) 262 that is coupled to input node 202. The output at node 204 is converted by a DAC 260 to a voltage $V_rD_{j-1}$ for a next pipeline stage. Thus, processing of successive bits is provided by successive pipeline stages.

Figure 3B:
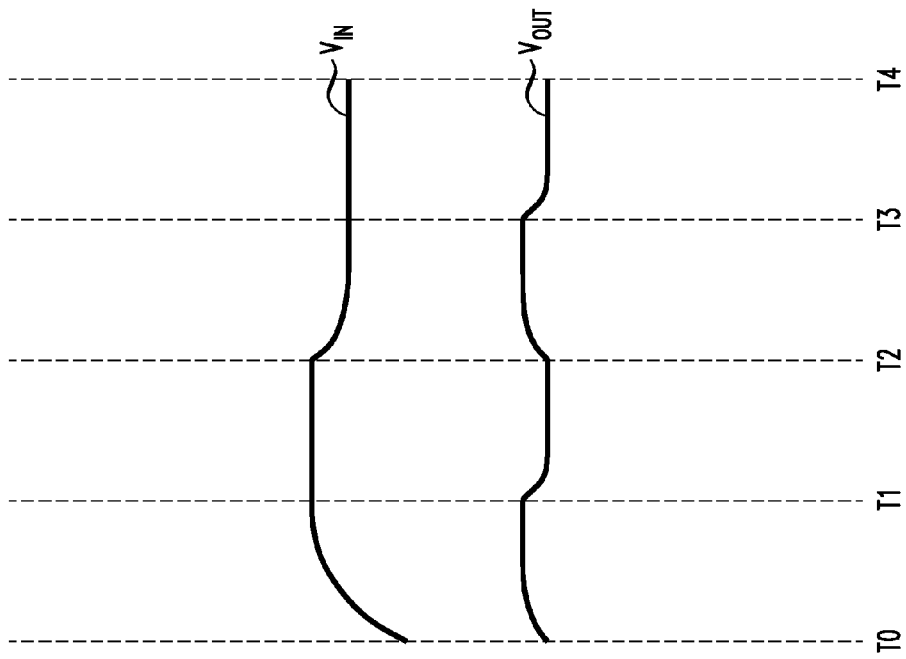
FIG. 3B is a timing diagram showing input and output signals in accordance with an exemplary embodiment.
Figure 3A:
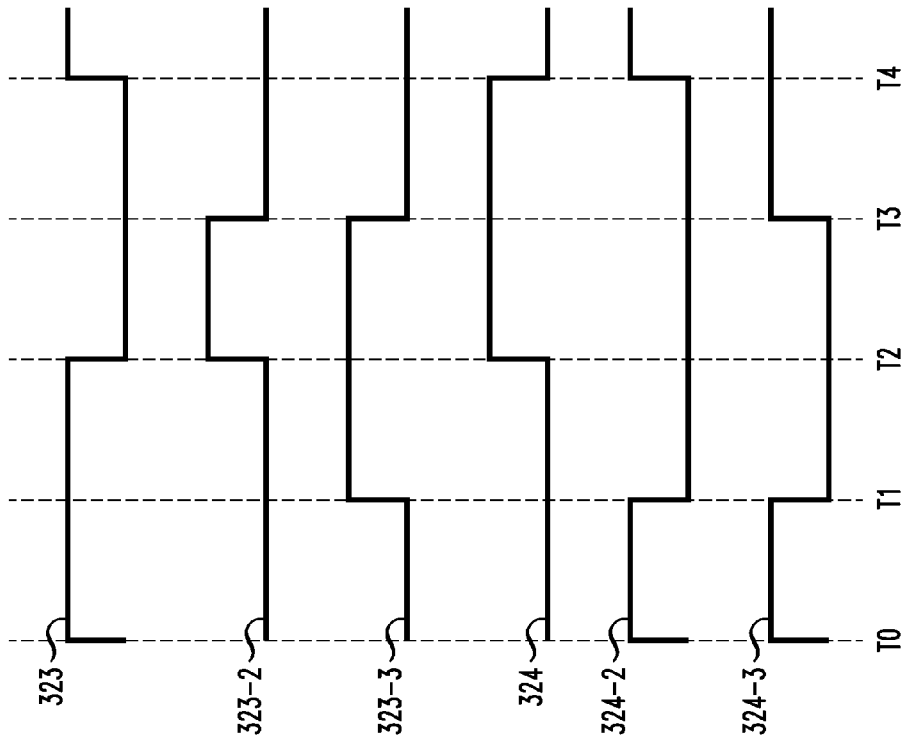
FIG. 3A is a timing diagram showing control signals in accordance with an exemplary embodiment.

FIG. 3A is a timing diagram showing control signals that control a coupling arrangement of circuit 200. Control circuit 250 may provide control signals 323, 323-2, 323-3, 324, 324-2, and 324-3 and may cycle through four phases, corresponding to four states of circuit 200. Control circuit 250 may receive a two-bit clock signal CLK that may iterate through four states, e.g., as a counter that counts 00, 01, 10, 11. Known means may be used to translate such a two-bit clock signal into four distinct combinations of signal levels, i.e., four phases as in FIG. 3A. The number of signals (six in this example) are sufficient to control the switches. For example, one of ordinary skill in the art understands that a demultiplexer or an array of logic gates (not shown) may be used to produce four combinations of six-bit signal values <100011, 101000, 011100, 000101> from four distinct two-bit input signal values <00, 01, 10, 11> corresponding to the four phases of signals 323, 323-2, 323-3, 324, 324-2, and 324-3, respectively. In the discussion that follows, the convention is adopted that a logic high value ('1') corresponds to a closed switch, e.g., corresponding to the use of an NMOS gate having a high voltage applied to a gate terminal to allow current to flow between source and drain terminals; however, the opposite convention may be adopted as well. Additionally, in some embodiments, some of the switches in FIG. 2 may be closed by a control signal asserted high, and others may be closed by a control signal asserted low. In some embodiments, fewer than six control signals may be provided, as certain ones of the control signals may be derived from others, e.g., signal 324 may be the complement of signal 323 and thus may be derived from signal 323 via an inverter (not shown), and signal 323-3 may be the complement of signal 324. In other embodiments, signal 324 may not be complement of signal 323 at all times but rather at substantially all times due to non-idealities, i.e., during 80% or more of a period. In practice, the signals are usually non-overlapped in some embodiments.

The operation of circuit 200 may be understood with reference to FIG. 3A, which shows one cycle of control signals, with each cycle comprising four distinct time periods or phases. In a first phase between times T0 and T1, switches 223, 224-2, and 224-3 are closed, and the other switches are open. During the first phase, variable analog input voltage $V_{in}$ may change, i.e., increase or decrease, as an output of a sample-and-hold amplifier (SHA) (not shown). The input voltage $V_{in}$ is loaded (stored) on capacitors 231 and 232, and a pathway is created from an output of the operational amplifier 230 to the reference node 203 via output node 204 and capacitors 233 and 234. Switch 223c, which is controlled to open or close similarly as switches 223a and 223b, couples capacitors 231 and 232 to ground. In this phase, the operational amplifier 230 is configured in a feedback configuration as an integrating amplifier.

In a second phase between times T1 and T2, switches 223 and 223-3 are closed, and the other switches are open. As a result, capacitors 231 and 232 are coupled to input node 202 and to the inverting input of operational amplifier 230. During the second phase, $V_{in}$ may settle on a stable value as a result of the hold function provided of the SHA, as shown in FIG. 3B.

In a third phase between times T2 and T3, switches 223-2, 223-3, and 224 are closed, and the other switches are open. Switch 224c, which is controlled to open or close similarly as switches 224a and 224b, couples capacitors 233 and 234 to ground. As a result, the voltage previously stored on capacitors 231 and 232 (i.e., the voltage $V_{in}$ from the previous phase, i.e., the second phase) causes a voltage drop (difference) of $2*V_{in}-V_rD_{ji}$ across the two capacitors. The voltage drop may be understood as follows. Referring to FIG. 2, the following relationship holds according to the principles of charge conservation: $V_{in}*(C_{f1}+C_{s1})=V_{out}*C_{f1}$, where $C_{f1}$ and $C_{s1}$ are the capacitances of capacitors 231 and 232, respectively, and $V_{out}$ is the output voltage of an operational amplifier, e.g., operational amplifier 230. If $C_{s1}=C_{f1}$, it follows that $V_{out}=2*V_{in}$. Reference voltage $V_rD_j$ is subtracted from output voltage Vout because capacitor 232 is coupled to reference node 203 having reference voltage $V_rD_j$. FIG. 3B shows that during the third phase, $V_{in}$ may charge or discharge towards a new value (i.e., a value different from the voltage Vin at the end of the second phase) as a result of a SHA.

In a fourth phase between times T3 and T4, switches 224 and 224-3 are closed, and the other switches are open. During the fourth phase, $V_{in}$ may settle on a new stable value (e.g., different than the stable value at the second phase), as shown in FIG. 3B. As a result, capacitors 233 and 234 are coupled to input node 202 and to the inverting input of operational amplifier 230. The configuration alternates states between charging one set of capacitors and reading the other set, to reading the one set and charging the other set. Thus, a stable input voltage value $V_{in}$ at an even phase (e.g., the second phase or the fourth phase) results in output node 204 having a voltage $2*V_{in}-V_rD_j$ at a following odd phase (namely the third phase, or the first phase that occurs after the fourth phase of a previous cycle).

The relationship between input voltage (e.g., from a SHA) and output voltage (i.e., quantized result) is thus understood with reference to FIG. 3B. A voltage $V_{in}$ is sampled and held during phases one and two corresponding to times T0 through T2 (and also at phases three and four corresponding to times T2 through T4) and quantized to provide an digitized result at phase three corresponding to times T2 through T3 (and also at phase one that follows a previous phase four). Voltage at output node 204 is a function of the input voltage applied during a preceding phase, not the current phase, because of the switching described above. The four phases described above repeat, so a sample-and-hold (SHA) output provided at $V_{in}$ may be quantized at output node 204, with time interleaving enabled by dual switched capacitor circuits 210a, 210b.

Input voltage may be provided by a sample-and-hold amplifier (not shown in FIG. 2). A sample state may correspond to the first and second phases described above, i.e., between times T0 and T2. During this time, the input voltage may settle at a voltage Vin that appears, in a next phase (e.g., the third phase) at output node 204 as signal having voltage $2*V_{in}-V_rD_j$.

Thus, circuit 200, and more specifically switched capacitor circuits 210a, 210b therein, alternate between two functional phases (where the term "phase" is understood to be different from the four phases of a clock cycle described above): a first phase in which an input voltage is stored (using capacitors), and a second phase in which a feedback path provides a voltage drop (e.g., of $2*V_{in}-V_rD_j$) that is enabled by the previously stored voltage (i.e., previous input voltage). Because only one of switches 223-3 and 224-3 is closed at a time (with the other one being open), only one of the switched capacitor circuits 210a, 210b is coupled at a time to the operational amplifier to provide an analog output signal at output node 204. Thus, the combination of two states per switched capacitor circuit and only one switched capacitor circuit coupled to the operational amplifier 230 at a time results in four phases (making it clear why four phases are shown in the timing diagram of FIG. 3A). The analog output signal at node 204 may be regarded as the digital representation of analog input signal $V_{in}$, i.e., circuit 200 provides analog to digital conversion.

Switches 223a and 223b are controlled by signal 323, and this switch bank may be characterized as a double pole single throw (DPST) switch configuration. Similarly, switches 224a and 224b controlled by signal 324 may be characterized as a DPST switch configuration. The pair of DPST switches corresponding to switches 223 and 224 alternately couples the input node 202 to capacitors 231, 232 or to capacitors 233, 234 in respective parallel coupled configurations. A DPST switch comprising switches 223-2a and 223-2b, controlled by control signal 323-2, and a DPST switch comprising switches 224-2a and 224-2b, controlled by control signal 324-2, are configured to alternately charge the capacitors of the first and second switched capacitor circuits 210a, 210b, respectively, or couple the capacitors of the first and second switched capacitor circuits 210a, 210b, respectively, to the operational amplifier 230. Switches 223-3 and 224-3 may be a DPST switch configured to alternately couple the operational amplifier 230 to the first switched capacitor circuit 210a or the second switched capacitor circuit 210b.

In other embodiments, different switching configurations are used. For example, a single pole double throw (SPDT) switch (not shown) may be used in place of switch bank 223, and a SPDT switch may similarly be used in place of switch bank 224. Similarly, a SPDT switch may replace switches 223-3 and 224-3. Suitable control signals may be provided by control circuit 250.

Circuit 200 has one operational amplifier compared to the two operational amplifiers required by known circuit 100, resulting in decreased power consumption, chip area, and cost. If a sample-and-hold amplifier (SHA) is configured to provide the input voltage $V_{in}$, the SHA and circuit 200 may use the same sampling frequency, whereas known circuit 100 provides a sampling frequency $f_s$ to SHA 105 and a sampling frequency $f_s/2$ to switched capacitor circuits 110a and 110b. Circuit 200 replaces a two-channel analog to digital converter (ADC) as in known circuit 100 with an alternate switched capacitor configuration that enables a relaxation of specifications (e.g., in terms of bandwidth and bias current) of a SHA that may be used to provide input voltage $V_{in}$ at node 202. Additionally, in an embodiment using circuit 200 in conjunction with a SHA, the output voltage range (swing) of operational amplifier 230 is reduced relative to the prior art, reducing power consumption.

Figure 4:
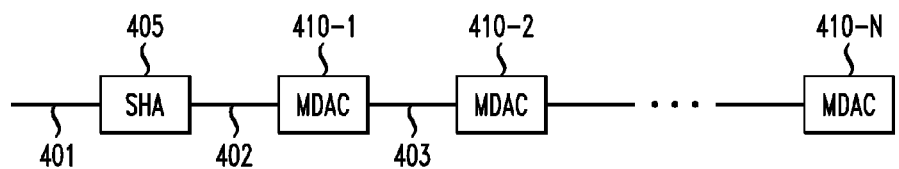
FIG. 4 is a block diagram of an N-bit pipeline analog to digital converter (pipeline ADC) in accordance with an exemplary embodiment.

FIG. 4 is a block diagram of an N-bit pipeline analog to digital converter (pipeline ADC) in accordance with an exemplary embodiment. A pipeline ADC 400 has a chain of N pipeline stages, which may be a chain of N multiplying digital to analog converters (MDACs) 410-1, 410-2, . . . , 410-N (generally 410). Pipeline ADC may also have a sample-and-hold amplifier (SHA) 405. An analog input signal 402 is provided to a first MDAC 410-1 and may be provided by SHA 405, which may be a pre-charge SHA, as a result of processing a presampled signal 401 by known means.

At MDAC 410-1, the analog input signal 402 is converted to a digital output signal 403 by circuitry as in FIG. 2. In other words, MDAC 410-1 may comprise switched capacitors 210a and 210b, operational amplifier 230, control circuit 250, and DAC 260, which may be a known DAC. Analog input signal 202 may be provided to MDAC 410-1 as an input, and an output 403 of MDAC 410-1 may correspond to output node 204 of FIG. 2. Outputs of the MDACs may represent presampled signal 401 in digital format. This digital signal 413 represents one bit of the N bits of resolution provided by pipeline ADC 400. Because an output of a $k^{th}$ MDAC 410-$k$ may be represented as $2*V_{in\_k}-V_rD_k$, an error from each stage is passed to the next stage, representing the remainder that needs to be digitized in the subsequent smaller-resolution bits. In this manner, each stage (each MDAC) 410-$i$ provides one bit of the digital representation of analog input signal 402, with MDAC 410-1 providing a most significant bit (MSB)

and MDAC 410-N providing a least significant bit (LSB). Control circuitry is not shown in FIG. 4 for brevity but is understood to be implementable by one of ordinary skill in the art. Pipeline ADC 400 is more efficient than prior art pipeline ADCs due to power, area, and cost savings resulting from the switched capacitor arrangement described above.

Figure 5:
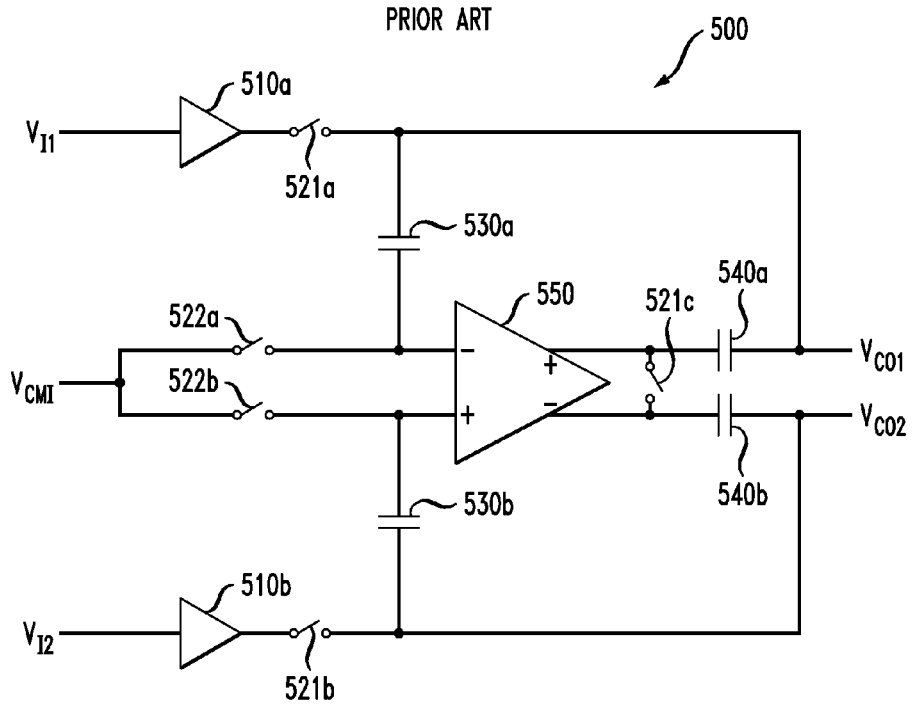
FIG. 5 is a block diagram of a pre-charge sample-and-hold amplifier (SHA).

FIG. 5 is a circuit diagram of a known pre-charge sample-and-hold amplifier (SHA) described at Hsu et al., "A CMOS 33-mW 100-MHz 80-dB SFDR Sample-and-Hold Amplifier," IEICE Trans. Electron., Vol. E85-C, No. 1 Jan. 2002. Pre-charge SHAs are also described at, e.g., U.S. Pat. No. 6,529,049 by Erhart et al, which is hereby incorporated by reference herein in its entirety. The example SHA 500 shown in FIG. 5 is one example of an SHA, and other SHAs may be used in other embodiments. A differential input voltage is provided as $V_{i1}$, $V_{i2}$ and buffered by input buffers 510a and 510b. Switches 521a and 521b, controlled by a control signal 531, conditionally couple the output of buffers 510a, 510b to capacitors 530a, 530b, respectively. Capacitors 530a and 530b are coupled to inputs of an operational amplifier 550, which inputs are conditionally coupled to a common mode input voltage $V_{cmi}$ based on switches 522a and 522b controlled by a control signal 532. Capacitors 540a and 540b are coupled to outputs of operational amplifier 550. A switch 521c, controlled by control signal 531, conditionally couples capacitors 540a and 540b. A differential output voltage is provided as $V_{co1}$, $V_{co2}$. In other embodiments, a single-ended output voltage may be provided. Voltage $V_{co1}$ may correspond to input voltage $V_{in}$ in FIG. 2. In a real (non-ideal) circuit, Vin may be provided as a differential signal with $V_{co1}$ and $V_{co2}$.

Figure 5A:
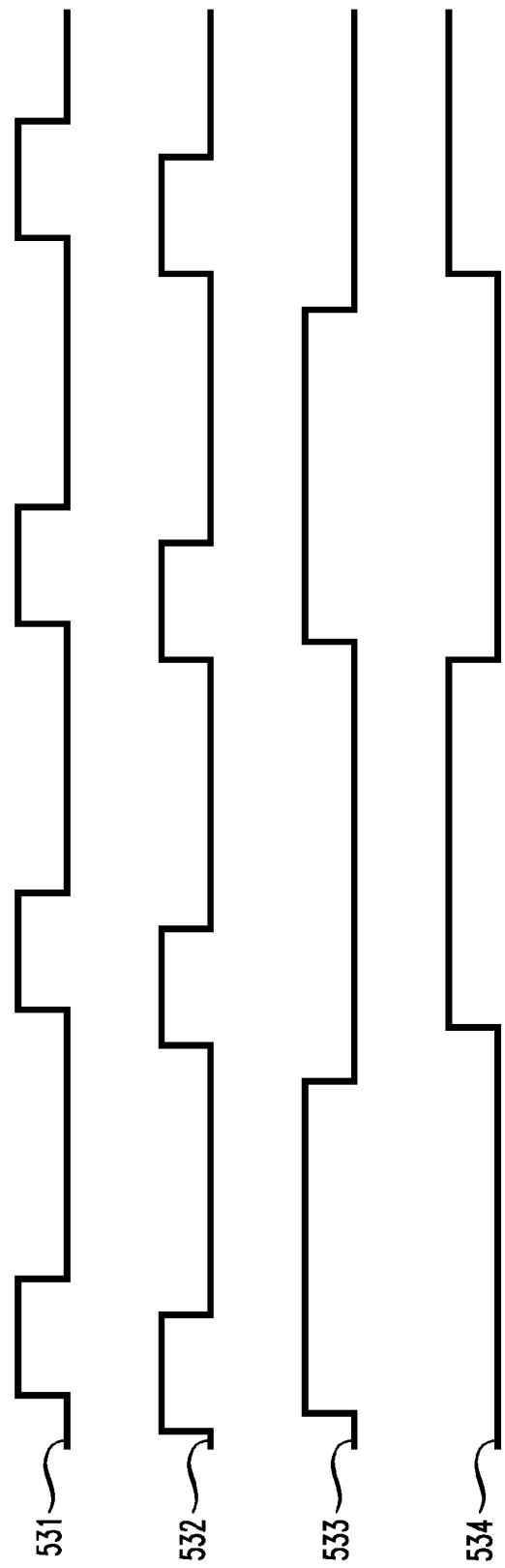
FIG. 5A is a timing diagram showing control signals used with the SHA of FIG. 5.

FIG. 5A is a timing diagram showing control signals used with the SHA of FIG. 5. Control signal 531 controls switches 521a, 521b, and 521c, and control signal 532 controls switches 522a and 522b. Control signals 533 and 534 may be control signal 323 and 324, respectively, of FIG. 3A; these control signals are not always complements of one another in some embodiments, as shown in FIG. 5A.

In some embodiments, an output of an operational amplifier, e.g., operational amplifier 230, exhibits less voltage swing (a narrower range of voltages) than an output of a capacitor used for sampling, e.g., any of capacitors 231, 232, 233, 234, thereby reducing power consumption. Some embodiments are suited for high voltage operation. Time interleaving is achieved in some embodiments with only one operational amplifier at a stage of a pipeline ADC.

The above illustrations provide many different embodiments for implementing different features. Specific embodiments of components and processes are described to help clarify the invention. These are, of course, merely embodiments and are not intended to serve as limitations beyond those described in the claims.

Although embodiments are illustrated and described herein in one or more specific examples, embodiments are nevertheless not intended to be limited to the details shown, since various modifications and structural changes may be made therein without departing from the spirit of the embodiments and within the scope and range of equivalents of the claims.

What is claimed is:

1. A circuit comprising:
    an input node having a variable analog input voltage;
    a first switched capacitor circuit and a second switched capacitor circuit, each switched capacitor circuit comprising a first capacitor and a second capacitor, each switched capacitor circuit coupled to the input node;
    an operational amplifier configured to be conditionally coupled to only one of the first and second switched capacitor circuits at a time and configured to conditionally provide feedback to the switched capacitor circuits via an output node; and
    a control circuit coupled to the first and second switched capacitor circuits for conditional coupling to the operational amplifier, wherein the first and second switched capacitor circuits are conditionally coupled to one of an inverting input and a noninverting input of the operational amplifier and the other of the inverting input and the noninverting input is coupled to a ground node.

2. The circuit of claim 1 wherein the control circuit is configured to operate in switched phases wherein certain of the phases couple one of the first and second switched capacitor circuits to the analog input voltage.

3. The circuit of claim 1 wherein the first switched capacitor circuit further comprises:
    first and second switches configured to conditionally couple the first and second capacitors, respectively, of the first switched capacitor circuit to the input node based on a first switching signal from the control circuit;
    a third switch configured to conditionally couple the first capacitor of the first switched capacitor circuit to the output node based on a second switching signal from the control circuit;
    a fourth switch configured to conditionally couple the second capacitor of the first switched capacitor circuit to a reference node having a reference voltage based on the second switching signal; and
    a fifth switch configured to conditionally couple the first and second capacitors of the first switched capacitor circuit to the operational amplifier based on a third switching signal;
    and wherein the second switched capacitor circuit comprises:
    sixth and seventh configured to conditionally couple the first and second capacitors, respectively, of the second switched capacitor circuit to the input node based on a fourth switching signal;
    a eighth switch configured to conditionally couple the first capacitor of the second switched capacitor circuit to the output node based on a fifth switching signal;
    a ninth switch configured to conditionally couple the second capacitor of the second switched capacitor circuit to the reference node based on the fifth switching signal; and
    a tenth switch configured to conditionally couple the first and second capacitors of the second switched capacitor circuit to the operational amplifier based on a sixth switching signal.

4. The circuit of claim 3 wherein each switched capacitor circuit is configured to:
    store, in a first state, the analog input voltage on the capacitors of that switched capacitor circuit;
    provide, in a second state, a voltage difference across the capacitors of that switched capacitor circuit along a feedback path from the operational amplifier to the reference node.

5. The circuit of claim 3, wherein the switching signals each have four phases per cycle, and further wherein:
    during a first phase, the first, fifth and sixth switching signals are configured to close their corresponding switches, and the second, third, and fourth switching signals are configured to open their corresponding switches;

during a second phase, the first and third switching signals are configured to close their corresponding switches, and the second, fourth, fifth, and sixth switching signals are configured to open their corresponding switches;

during a third phase, the second, third, and fourth switching signals are configured to close their corresponding switches, and the first, fifth, and sixth switching signals are configured to open their corresponding switches; and during a fourth phase, the fourth and sixth switching signals are configured to close their corresponding switches, and the first, second, third, and fifth switching signals are configured to open their corresponding switches.

6. The circuit of claim 1 wherein each of the switched capacitor circuits further comprises at least one switch bank configured to alternately couple the input node to at least one of the capacitors of that switched capacitor circuit to load the analog input voltage on the at least one of the capacitors.

7. The circuit of claim 1 wherein each of the switched capacitor circuits further comprises a switch configured to conditionally couple that switched capacitor circuit to an input of the operational amplifier.

8. The circuit of claim 1 wherein the control circuit is configured to control a first pair and a second pair of double pole single throw switches to alternately couple the input node to the capacitors of the first switched capacitor circuit or the capacitors of the second switched capacitor circuit in respective parallel coupled configurations.

9. The circuit of claim 1 wherein the control circuit is configured to control a first pair and a second pair of double pole single throw switches configured to alternately charge the capacitors of the first and second switched capacitor circuits, respectively, or couple the capacitors of the first and second switched capacitor circuits, respectively, to the operational amplifier.

10. The circuit of claim 1 wherein the control circuit is configured to control a pair of double pole single throw single throw switches configured to alternately couple the operational amplifier to the first switched capacitor circuit or the second switched capacitor circuit.

11. The circuit of claim 1 wherein the control circuit is configured to:

control a first pair and a second pair of double pole single throw switches to alternately couple the input node to the capacitors of the first switched capacitor circuit or the capacitors of the second switched capacitor circuit in respective parallel coupled configurations;

control a third pair and a fourth pair of double pole single throw switches configured to alternately charge the capacitors of the first and second switched capacitor circuits, respectively, or couple the capacitors of the first and second switched capacitor circuits, respectively, to the operational amplifier; and control a pair of double pole single throw single throw switches configured to alternately couple the operational amplifier to the first switched capacitor circuit or the second switched capacitor circuit;

wherein the third and fourth pairs of double pole single throw switches are configured to be closed when the first and second pairs, respectively, are closed and when the operational amplifier is coupled to the first and second switched capacitor circuits, respectively.

12. The circuit of claim 1 wherein the control circuit is configured to control a pair of single pole double throw switches to alternately couple the input node to the capacitors of the first switched capacitor circuit or the capacitors of the second switched capacitor circuit in respective parallel coupled configurations.

13. The circuit of claim 1 wherein the control circuit is configured to control a single pole double throw switch to alternately couple the operational amplifier to the first switched capacitor circuit or the second switched capacitor circuit.

14. An N-bit pipeline analog to digital converter (pipeline ADC) comprising:

N multiplying digital to analog converters (MDACs) coupled in series, each MDAC comprising:
an input node having a variable analog stage input voltage;
a first switched capacitor circuit coupled to the input node and having a first capacitor and a second capacitor coupled in parallel to one another;
a second switched capacitor circuit coupled to the input node and having a third capacitor and a fourth capacitor coupled in parallel to one another;
an operational amplifier configured to be conditionally coupled to one and only one of the switching circuits and configured to conditionally provide a digital stage output signal to the switched capacitor circuits via an output node; and
a control circuit configured to provide a plurality of switching signals to control a coupling arrangement of the switched capacitor circuits; and a digital to analog converter (DAC) configured to receive the digital stage output signal and provide a stage reference signal to the first and second switched capacitor circuits via a reference node.

15. The pipeline ADC of claim 14, further comprising a sample-and-hold amplifier (SHA) configured to receive an analog input signal and provide a SHA output signal to the first MDAC, wherein the digital stage output signals of the MDACs represent the analog input signal in digital format.

16. The pipeline ADC of claim 14, wherein the control circuit is configured to:

cycle through four states to alternately store the analog stage input voltage on the first and second capacitors, provide a voltage difference of $2*V_{in}-V_rD_j$ across the first and second capacitors along a feedback path from the operational amplifier to the reference node, store the analog input voltage on the third and fourth capacitors, and provide a voltage difference of $2*V_{in}-V_rD_j$ across the third and fourth capacitors along a feedback path from the operational amplifier to the reference node, wherein Vin is the analog input voltage and $V_rD_j$ is the stage reference signal.

17. A method of processing an analog signal in an integrated circuit, the method comprising:

receiving a variable analog input signal on an input node;
receiving at least one switching signal;
providing the analog input signal to a first switched capacitor circuit having first and second capacitors coupled in parallel to one another and to a second switched capacitor circuit having third and fourth capacitors coupled in parallel to one another;
conditionally coupling the capacitors to the input node based on the at least one switching signal;
conditionally amplifying an output of one of the switched capacitor circuits, based on the at least one switching signal, to provide an analog output signal;
conditionally feeding back the analog output signal to the switched capacitor circuits based on the at least one switching signal;

storing, in a first state of each switched capacitor circuit, an input voltage corresponding to the input node on the capacitors of that switched capacitor circuit; and providing a voltage difference, in a second state of each switched capacitor circuit, across the capacitors of that switched capacitor circuit.

18. The circuit of claim 4, wherein the voltage difference is $2*V_{in}-V_rD_j$ and further wherein $V_{in}$ is the analog input voltage and $V_rD_j$ is the reference voltage.

19. The method of claim 17, wherein the voltage difference is $2*V_{in}-V_rD_j$ and further wherein $V_{in}$ is the input voltage and $V_rD_j$ is a reference voltage.

20. A circuit comprising:
an input node having a variable analog input voltage;
a first switched capacitor circuit and a second switched capacitor circuit, each switched capacitor circuit comprising a first capacitor and a second capacitor, each switched capacitor circuit coupled to the input node;

an operational amplifier configured to be conditionally coupled to only one of the first and second switched capacitor circuits at a time and configured to conditionally provide feedback to the switched capacitor circuits via an output node; and a control circuit coupled to the first and second switched capacitor circuits for conditional coupling to the operational amplifier;

wherein each switched capacitor circuit further comprises a switch bank configured to:
conditionally couple the first capacitor of said switched capacitor circuit in parallel with the operational amplifier, and
conditionally couple the second capacitor of said switched capacitor circuit to a reference node.

* * * * *

UNITED STATES PATENT AND TRADEMARK OFFICE
CERTIFICATE OF CORRECTION

PATENT NO. : 8,279,102 B2
APPLICATION NO. : 12/898261
DATED : October 2, 2012
INVENTOR(S) : Fang-Shi Jordan Lai et al.

Page 1 of 1

It is certified that error appears in the above-identified patent and that said Letters Patent is hereby corrected as shown below:

Claim 3, Column 8, Line 38, after "sixth and seventh", insert -- switches --.

Claim 3, Column 8, Line 42, delete "a" and insert -- an --.

Signed and Sealed this
Fifth Day of March, 2013

Teresa Stanek Rea
*Acting Director of the United States Patent and Trademark Office*